(12) United States Patent
Lim et al.

(10) Patent No.: US 9,425,341 B2
(45) Date of Patent: Aug. 23, 2016

(54) P-I-N PHOTODIODE WITH DOPANT DIFFUSION BARRIER LAYER

(71) Applicant: Agency for Science, Technology and Research, Singapore (SG)

(72) Inventors: Andy Eu-Jin Lim, Singapore (SG); Tsung-Yang Liow, Singapore (SG); Patrick Guo-Qiang Lo, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/048,379

(22) Filed: Oct. 8, 2013

(65) Prior Publication Data
US 2014/0138789 A1 May 22, 2014

(30) Foreign Application Priority Data
Oct. 8, 2012 (SG) .................. 201207481-1

(51) Int. Cl.
| | | |
|---|---|---|
| H01L 31/075 | (2012.01) | |
| H01L 31/105 | (2006.01) | |
| H01L 31/117 | (2006.01) | |
| H01L 31/18 | (2006.01) | |

(52) U.S. Cl.
CPC .......... *H01L 31/105* (2013.01); *H01L 31/1804* (2013.01); *H01L 31/1812* (2013.01); *Y02E 10/547* (2013.01)

(58) Field of Classification Search
CPC ............ H01L 33/0012; H01L 51/4293; H01L 31/075; H01L 31/105; H01L 31/117; H01L 27/14643

USPC .......................................................... 257/458
See application file for complete search history.

(56) References Cited

U.S. PATENT DOCUMENTS

| | | | |
|---|---|---|---|
| 4,885,622 A * | 12/1989 | Uchiyama et al. | ............... 257/53 |
| 4,904,608 A * | 2/1990 | Gentner et al. | .................. 438/72 |
| 5,212,705 A | 5/1993 | Kahen et al. | |
| 5,892,786 A | 4/1999 | Lott | |
| 6,015,721 A | 1/2000 | Kim | |
| 6,265,727 B1 | 7/2001 | Kozodoy et al. | |
| 6,407,440 B1 | 6/2002 | Rhodes | |
| 6,437,372 B1 * | 8/2002 | Geva | ..................... B82Y 20/00 257/102 |
| 6,555,890 B2 | 4/2003 | Dries et al. | |
| 6,566,724 B1 | 5/2003 | Gutierrez-Aitken et al. | |
| 6,586,718 B2 | 7/2003 | Matsuda | |
| 6,730,900 B2 | 5/2004 | Hsish et al. | |
| 6,730,914 B2 | 5/2004 | Chao et al. | |
| 6,743,657 B2 | 6/2004 | Dries et al. | |
| 6,943,051 B2 | 9/2005 | Augusto et al. | |

(Continued)

FOREIGN PATENT DOCUMENTS

JP        06-05895 A       1/1994

OTHER PUBLICATIONS

Singapore Application Ser. No. 2013075379, Search Report mailed on Oct. 20, 2015, 4 pgs.

(Continued)

*Primary Examiner* — Phuc Dang
(74) *Attorney, Agent, or Firm* — Schwegman Lundberg & Woessner, P.A.

(57) ABSTRACT

According to one aspect of the invention, there is provided a pin photodetector comprising a dopant diffusion barrier layer disposed within an active light absorbing region of the pin photodetector.

17 Claims, 10 Drawing Sheets

(56) References Cited

U.S. PATENT DOCUMENTS

| | | |
|---|---|---|
| 7,116,851 B2 | 10/2006 | Welch et al. |
| 7,161,220 B2 | 1/2007 | Cohen et al. |
| 7,209,623 B2 | 4/2007 | Morse |
| 7,265,006 B2 | 9/2007 | Augusto et al. |
| 7,553,690 B2 | 6/2009 | Francis et al. |
| 7,557,368 B2 | 7/2009 | Hegarty et al. |
| 7,728,366 B2 | 6/2010 | Oohashi |
| 7,777,290 B2 | 8/2010 | Lagally et al. |
| 7,851,782 B2 | 12/2010 | Seeds et al. |
| 7,949,024 B2 | 5/2011 | Joseph |
| 8,022,494 B2 | 9/2011 | Miyachi et al. |
| 8,461,624 B2 | 6/2013 | Na et al. |
| 8,598,673 B2 | 12/2013 | Joshi et al. |
| 8,723,221 B2 | 5/2014 | Na et al. |
| 8,742,560 B2 | 6/2014 | Adkisson et al. |
| 8,748,799 B2 | 6/2014 | Wober |
| 8,773,336 B2 | 7/2014 | Knapp |
| 8,848,757 B2 | 9/2014 | Joseph |
| 8,890,271 B2 | 11/2014 | Tut et al. |
| 8,963,169 B2 | 2/2015 | Augusto |
| 8,995,485 B2 | 3/2015 | Joseph et al. |
| 2003/0089958 A1* | 5/2003 | Gutierrez-Aitken et al. . 257/458 |
| 2003/0209771 A1* | 11/2003 | Akulova ............... H01S 5/227 257/432 |
| 2004/0145026 A1 | 7/2004 | Sun |
| 2007/0194357 A1* | 8/2007 | Oohashi et al. ............. 257/292 |
| 2008/0012002 A1* | 1/2008 | Sakong ............... H01L 33/06 257/13 |
| 2010/0133506 A1* | 6/2010 | Nakanishi ............. B82Y 20/00 257/13 |
| 2012/0201488 A1 | 8/2012 | Liow et al. |
| 2015/0078711 A1 | 3/2015 | Ootorii |

OTHER PUBLICATIONS

Jutzi, M., et al., "Ge-On-Si Vertical Incidence Photodiodes With 39-Ghz bandwidth", *IEEE Photonics Technology Letters*, 17(7), (Jul. 2005), 1510-1512.

* cited by examiner

P-I-N PHOTODIODE WITH DOPANT DIFFUSION BARRIER LAYER

PRIORITY CLAIM

This application claims the benefit of priority of Singapore Patent Application No. 201207481-1, filed 8 Oct. 2012, the benefit of priority of which is claimed hereby, and which is incorporated by reference herein in its entirety.

FIELD OF INVENTION

The invention relates generally to a p-i-n (pin) photodiode.

BACKGROUND

Effort has been devoted in Silicon (Si) compatible photonics during the last two decades, especially in the field of active devices. Active building blocks have been fabricated on Si optical modulators and Germanium (Ge) photodetectors, with some showing integration with standard complementary metal-oxide-semiconductor (CMOS) circuits or other optical components.

Ge has been investigated for active photonics devices, particularly for light detection at optical communication wavelengths (of around 1.3 to 1.55 µm). High performance Ge photodetectors have been realized due to its favorable absorption coefficient at these wavelengths.

A Ge photodetector needs low dark current, high responsivity and high bandwidth for optimum performance. Doping profiles must be optimized such that the electron-hole generation region remains intrinsic during operation. Phosphorus diffusion in Ge is extremely fast, resulting in non-abrupt junctions and higher dopant concentrations in intrinsic regions. This effectively increases device capacitance at a fixed operating bias and reduces photodetector bandwidth (RC-limit).

A low annealing temperature at 500° C. would be able to restrict dopant diffusion. However, this is at the expense of higher dopant activation and limits device integration compatibility with backend CMOS processes which uses temperatures of up to 600-700° C.

There is thus a need to address the above drawbacks for existing photodetectors.

SUMMARY

According to one aspect of the invention, there is provided a pin photodetector comprising a dopant diffusion barrier layer disposed within an active light absorbing region of the pin photodetector.

According to another aspect of the invention, there is provided A method of fabricating a pin photodetector, the method comprising: providing a first semiconductor layer having a region doped to a first polarity; providing a second semiconductor layer having a region doped to a second polarity, the second polarity being opposite to the first polarity; providing a dopant diffusion barrier layer between the first semiconductor layer and the second semiconductor layer; and doping the first semiconductor layer to a higher doped portion within the region doped to a first polarity, wherein the dopant diffusion barrier layer reduces doping of the first polarity to form an intrinsic layer between the dopant diffusion barrier layer and the second semiconductor layer, so that the dopant diffusion barrier layer is disposed between the first semiconductor layer and the intrinsic layer, and the intrinsic layer is disposed between the dopant diffusion barrier layer and the second semiconductor layer, wherein the intrinsic layer has a region doped to the first polarity to a concentration less than that of the higher doped portion of the first semiconductor layer.

BRIEF DESCRIPTION OF THE DRAWINGS

Example embodiments of the invention will be better understood and readily apparent to one of ordinary skill in the art from the following written description, by way of example only, and in conjunction with the drawings. The drawings are not necessarily to scale, emphasis instead generally being placed upon illustrating the principles of the invention, in which.

DEFINITIONS

Figure 1:
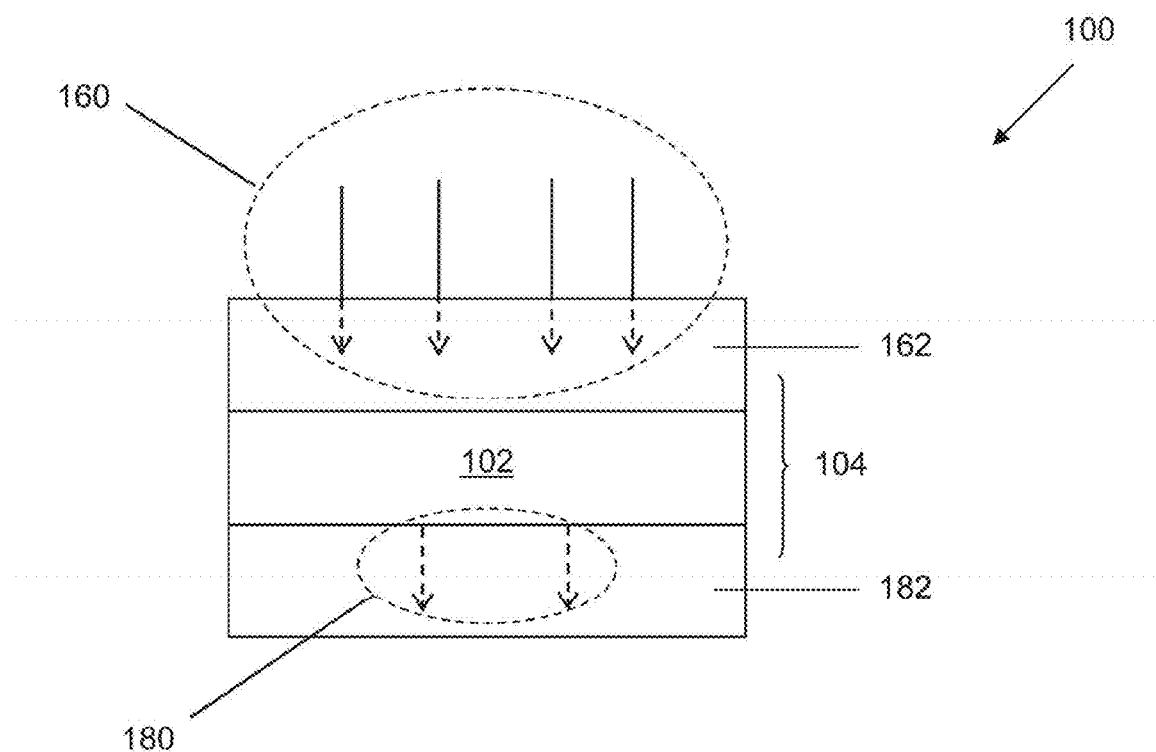
FIG. 1 shows a cross-section structure of a pin photodetector according to a first embodiment of the invention.

The following provides sample, but not exhaustive, definitions for expressions used throughout various embodiments disclosed herein.

The term "p-i-n photodetector" may refer to a diode with an intrinsic semiconductor region between a p-type semiconductor and an n-type semiconductor. The p-i-n photodetector (interchangeably referred to as a "pin photodetector") is typically operated under reverse bias such that charge carriers are emitted within the intrinsic region of the semiconductor electronic device as a consequence of absorption of energy from light of a certain wavelength.

The term "dopant diffusion barrier layer" may mean a semiconductor region that seeks to confine dopant, introduced during fabrication of the pin photodetector, to within a targeted region. The dopant diffusion barrier layer seeks to prevent spreading, through diffusion, of the dopant to surrounding regions where the presence of dopant is not desired as this would impair the desired properties of the pin photodetector. In various embodiments, the dopant diffusion barrier layer may be able to effectively restrict the dopant to the targeted region, so that the dopant diffusion barrier layer prevents dopant from diffusing across and provides anneal conditions whereby the dopants will not penetrate this layer. However, given that the depth of dopant diffusion penetration also depends on additional parameters, such as the thickness of the dopant diffusion barrier layer and thermal budget, the dopant diffusion barrier layer may serve to reduce the concentration of dopant that diffuses across.

The term "layer" is not necessarily a flat planar structure and may take the shape of an earlier layer upon which the layer is formed.

The term "active light absorbing region" may mean a depletion region present in the pin photodetector, which generates external carriers when exposed to light, the depletion region being enhanced when the pin photodetector is placed under reverse bias to encompass the dopant diffusion barrier layer under a sufficiently large bias.

The term "semiconductor" may mean materials that include silicon (Si), germanium (Ge), gallium arsenide (GaAs), indium gallium arsenide (InGaAs) and indium phosphide (InP).

The terms "first polarity" and "second polarity" may be understood in the context of forming the p-n junction of the pin photodetector. Accordingly, the structure, with which a respective one of either of these terms is associated, forms part of the p-n junction of the pin photodetector.

The term "higher doped portion" may mean a portion, within an already doped region, having a higher concentration of the same dopant. When a region is doped to a first polarity, there may be a higher doped portion having a higher concentration of dopant of the first polarity. Similarly, when a region is doped to a second polarity, there may be a higher doped portion having a higher concentration of dopant of the second polarity.

The term "intrinsic layer" may mean a semiconductor region that may be undoped or doped to a lesser extent compared to the other layers that comprise the pin photodetector.

DETAILED DESCRIPTION

In the following description, various embodiments are described with reference to the drawings, where like reference characters generally refer to the same parts throughout the different views.

It has been found that when fabricating a pin photodetector, dopant (such as phosphorus) diffuses extremely quickly in semiconductor material, like germanium, which results in non-abrupt junctions and higher dopant concentration in intrinsic region. This effectively increases device capacitance at a fixed operating bias and reduces photodetector bandwidth (as derived from an RC-limit of such pin photodetectors).

A low annealing temperature at 500° C. has been used to restrict dopant diffusion. However, this is at the expense of higher dopant activation and limits device integration compatibility with backend CMOS processes which uses temperatures up to 600-700° C.

Various embodiments of the present invention address the above shortcomings. FIG. 1 shows a cross-section structure of a pin photodetector 100 according to a first embodiment of the invention. The pin photodetector 100 includes a dopant diffusion barrier layer 102 disposed within an active light absorbing region 104 of the pin photodetector 100.

As part of fabricating the pin photodetector 100, the pin photodetector 100 is exposed to doping (represented by reference numeral 160). The in-situ placement of the dopant diffusion barrier layer 102 causes the dopant diffusion barrier layer 102 to completely prevent or at least limit the dopant that can diffuse past (represented by reference numeral 180). Accordingly, the dopant is confined within a targeted region 162 and the spreading of the dopant to a surrounding region 182 is limited. The dopant diffusion barrier layer 102 thus allows optimisation of doping profiles such that the electron-hole generation region remains intrinsic during operation.

Further embodiments of the invention incorporate the dopant diffusion barrier layer 102 of FIG. 1 as described below.

Figure 2:
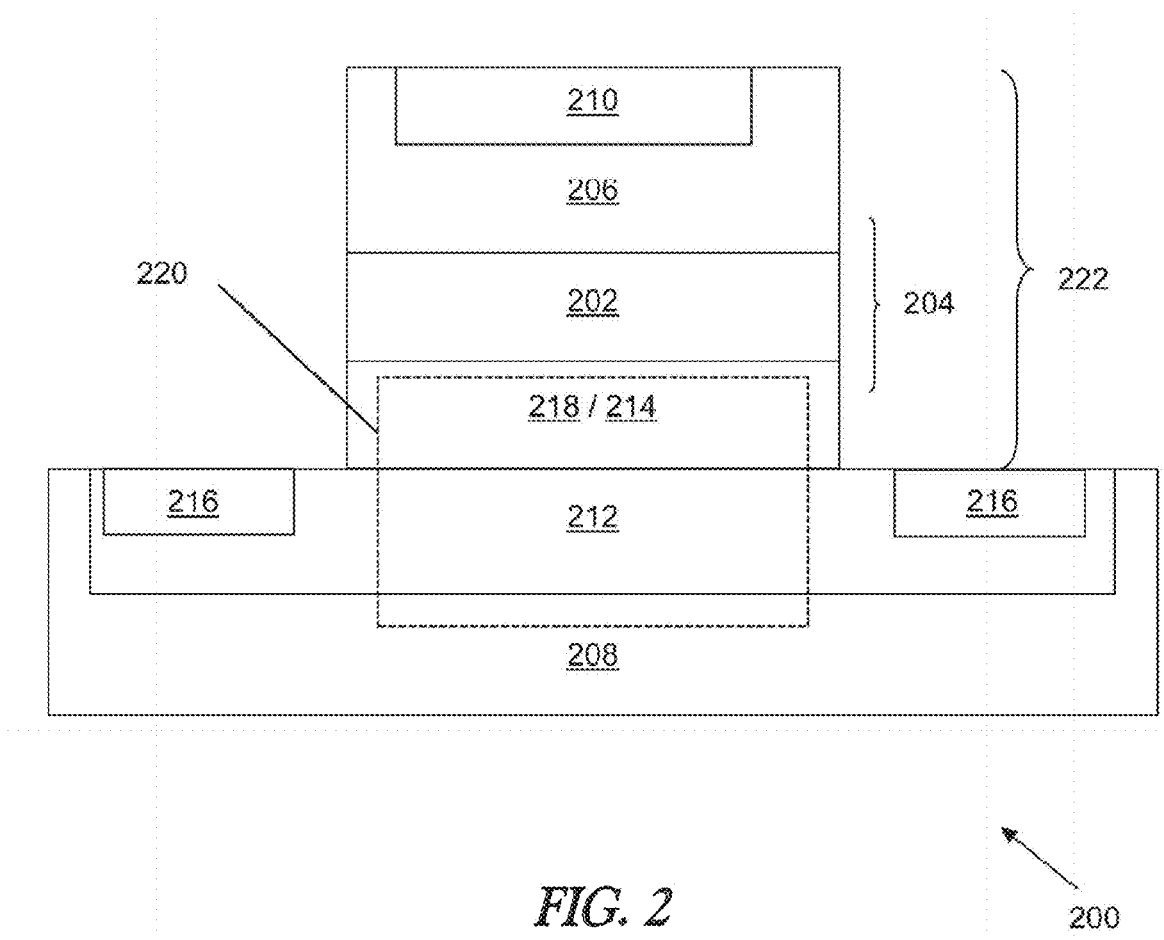
FIG. 2 shows a cross-section structure of a pin photodetector according to a second embodiment of the invention.

FIG. 2 shows a cross-section structure of a pin photodetector 200 according to a second embodiment of the invention.

The pin photodetector 200 comprises a first semiconductor layer 206 having a region doped to a first polarity and a second semiconductor layer 208 having a region 212 doped to a second polarity. In the second embodiment of the invention, the entire first semiconductor layer 206 may be doped to the first polarity or the doping is confined to a specific region of the first semiconductor layer 206. FIG. 2 also shows that only a specific region (that which is labeled 212) of the second semiconductor layer 208 is doped to the second polarity. However, the entire second semiconductor layer 208 may be doped to the second polarity. The second polarity is opposite to the first polarity. The first polarity may be from doping the first semiconductor layer 206 with an n-type dopant and the second polarity may be from doping the second semiconductor layer 208 with a p-type dopant.

A dopant diffusion barrier layer 202 is disposed between the first semiconductor layer 206 and the second semiconductor layer 208 for reducing doping of the first polarity into a region 218 between the dopant diffusion barrier layer 202 and the second semiconductor layer 208. This dopant diffusion barrier layer 202 may also extend the spreading of dopant to a region 220 that overlaps into the second semiconductor layer 208. Similar to the pin photodetector 100, the dopant diffusion barrier layer 202 is disposed within an active light absorbing region 204 of the pin photodetector 200.

The region doped to the first polarity of the first semiconductor layer 206 may have a higher doped portion 210. Similarly, the region 212 doped to the second polarity of the second semiconductor layer 208 may have a higher doped portion 216. The higher doped portion 216 of the second polarity and the higher doped portion 210 of the first polarity form a pn junction of the pin photodetector 200.

The region 218 between the dopant diffusion barrier layer 202 and the second semiconductor layer 208 may be an intrinsic layer 214. The intrinsic layer 214 is located so that the dopant diffusion barrier layer 202 is disposed between the first semiconductor layer 206 and the intrinsic layer 214, and the intrinsic layer 214 is disposed between the dopant diffusion barrier layer 202 and the second semiconductor layer 208. The intrinsic layer 214 has a region doped to the first polarity to a concentration less than that of the higher doped portion 210 of the first semiconductor layer 206 due to the presence of the dopant diffusion barrier layer 202, for the reasons mentioned above with respect to the dopant diffusion barrier layer 102 of FIG. 1.

As shown in FIG. 2, the first semiconductor layer 206, the dopant diffusion barrier layer 202 and the intrinsic layer 214 are provided as a stack 222 on the second semiconductor layer 208.

The dopant diffusion barrier layer 202 may comprise material that is different from the first semiconductor layer 206, whereby the first semiconductor layer 206 and the dopant diffusion barrier layer 202 may comprise materials from any one or more of Group IV semiconductors, an alloy of Group IV semiconductors (such as SiGe, SiC, GeC or GeSn) and Group III-V semiconductor compounds. For instance, suitable semiconductor pairs for the first semiconductor layer 206 and the dopant diffusion barrier layer 202 include germanium and silicon; germanium and a silicon-germanium alloy (such as $Si_{1-x}Ge_x$); or a silicon-germanium alloy and silicon.

The intrinsic layer 214 may comprise material that is the same as that of the first semiconductor layer 206.

The first semiconductor layer 206 and the dopant diffusion barrier layer 202 may respectively comprise a Group IV semiconductor and a Group III-V semiconductor compound pairing, such as germanium and silicon, germanium and a silicon-germanium alloy or a silicon-germanium alloy and silicon. The second semiconductor layer may comprise silicon, germanium or a silicon-germanium alloy.

Figures 3A, 3B:
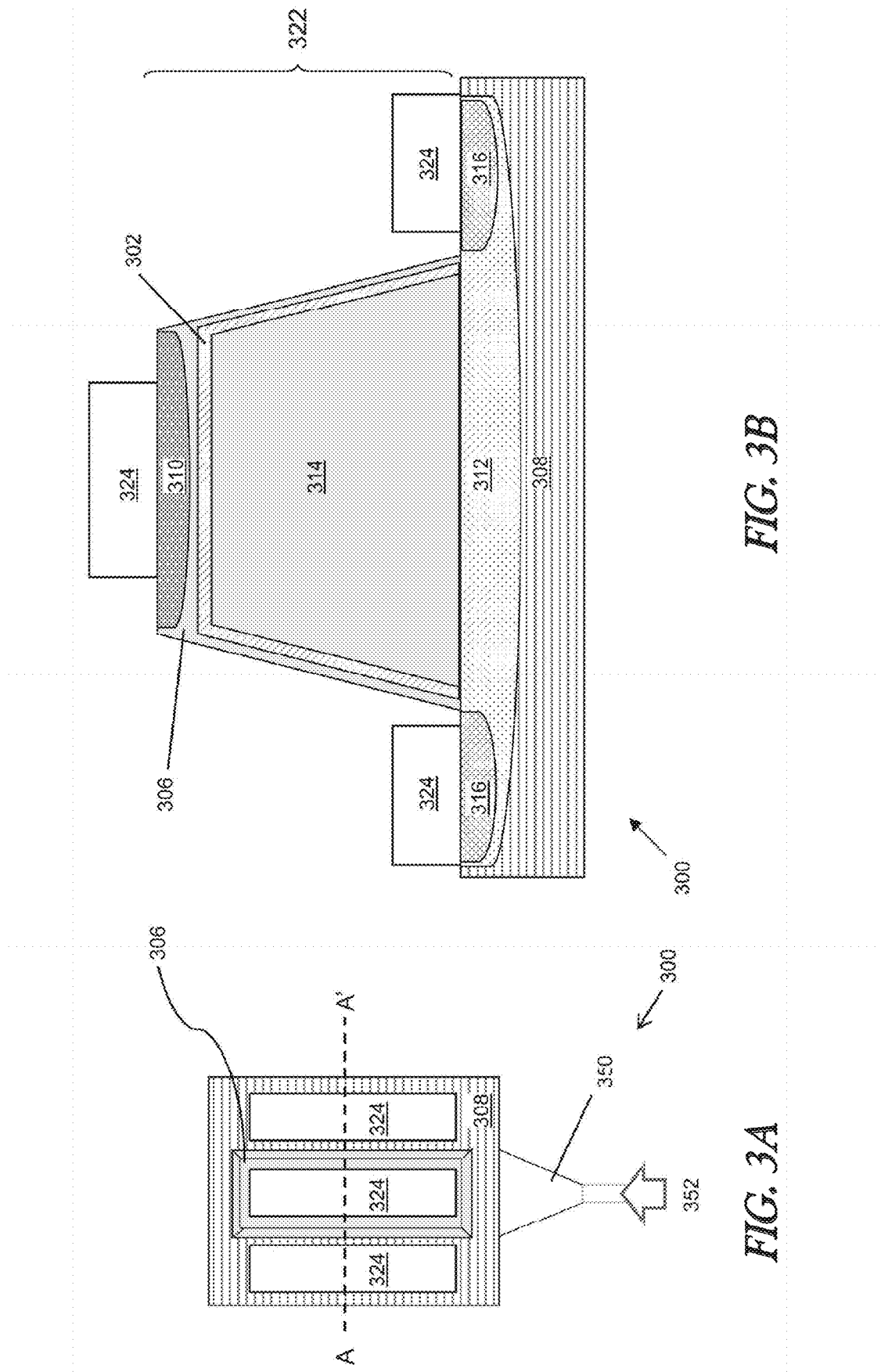
FIG. 3A shows a top view of a pin photodetector according to a preferred embodiment of the invention.
FIG. 3B shows a cross-section structure of the pin photodetector taken along line A-A' of FIG. 3A.

FIG. 3A shows a top view of a pin photodetector 300 according to a preferred embodiment of the invention. FIG. 3B shows a cross-section structure of the pin photodetector 300 taken along line A-A' of FIG. 3A.

The pin photodetector 300 comprises a first semiconductor layer 306, a second semiconductor layer 308, a dopant diffusion barrier layer 302, an intrinsic layer 314 and metal layers 324.

The first semiconductor layer 306 has a region doped to a first polarity and the second semiconductor layer 308 has a region 312 doped to a second polarity. The second polarity is opposite to the first polarity. The first polarity may be from doping the first semiconductor layer 306 with an n-type dopant and the second polarity may be from doping the second semiconductor layer 308 with a p-type dopant. The region doped to the first polarity of the first semiconductor layer 306 may have a higher doped portion 310. Similarly, the region 312 doped to the second polarity of the second semiconductor layer 308 may have a higher doped portion 316. The higher doped portion 316 of the second polarity and the higher doped portion 310 of the first polarity form a pn junction of the pin photodetector 300. Each of the metal layers 324 is in contact with each of the higher doped portion 316 of the second polarity and the higher doped portion 310 of the first polarity.

The dopant diffusion barrier layer 302 is disposed within an active light absorbing region of the pin photodetector 300. The dopant diffusion barrier layer 302 is disposed between the first semiconductor layer 306 and the intrinsic layer 314. The intrinsic layer 314 is disposed between the dopant diffusion barrier layer 302 and the second semiconductor layer 308. The intrinsic layer 314 has a region doped to the first polarity to a concentration less than that of the higher doped portion 310 of the first semiconductor layer 306 due to the presence of the dopant diffusion barrier layer 302, for the reasons mentioned above with respect to the dopant diffusion barrier layer 102 of FIG. 1.

As shown in FIG. 3B, the first semiconductor layer 306, the dopant diffusion barrier layer 302 and the intrinsic layer 314 are provided as a stack 322 on the second semiconductor layer 308, such that the respective bases of the first semiconductor layer 306, the dopant diffusion barrier layer 302 and the intrinsic layer 314 extend to be in contact with a surface of the second semiconductor layer 308.

In the preferred embodiment, germanium is used for the first semiconductor layer 306 and the intrinsic layer 314. Silicon is used for the dopant diffusion barrier layer 302. Silicon is also used for the second semiconductor layer 308. The top surface of the Ge first semiconductor layer 306 is n++ doped with phosphorus dopant to form the higher doped portion 310 of the first polarity. The top surface of the Si second semiconductor layer 308 is doped with boron to form the p+ region 312 doped to the second polarity and the p++ higher doped portion 316 of the second polarity.

As shown in FIG. 3B, metal electrodes (i.e. the metal layers 324) are placed at the sides and top of the Ge first semiconductor layer 306 to form a vertical pin diode. The Ge epitaxial stack 322 has a Si interlayer (IL) sandwiched in between the Ge layers used to realise the first semiconductor layer 306 and the intrinsic layer 314. A vertical electric field is applied to the photodetector 300 for photocurrent generation during operation. From FIG. 3A, an optical input 352 may be evanescently-coupled via a crystalline Si waveguide (WG) 350 into the Ge detector 300.

The Ge pin photodetector 300 may employ in-situ grown Si interlayer (i.e. the dopant diffusion barrier layer 302) for controlled dopant diffusion. The Si interlayer prevents phosphorus dopant diffusion downwards into Ge during activation anneal and other post Ge epitaxy annealing processes. This enables abrupt dopant junction formation in Ge and retains integrity of the intrinsic region 314.

Figure 4A:
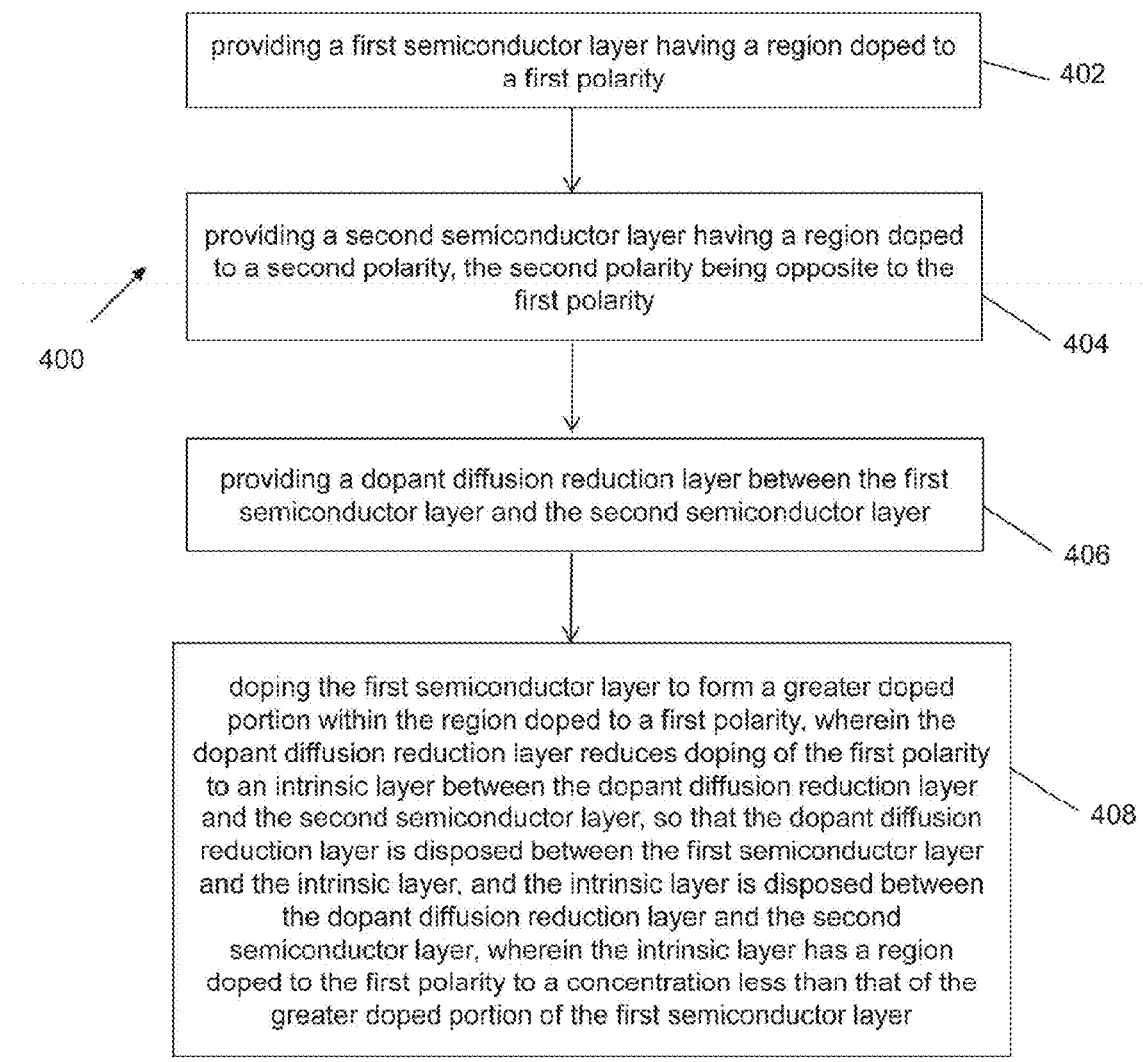
FIGS. 4A and 4B show a method to fabricate a pin photodetector, according to various embodiments of the invention.

FIG. 4A shows a method 400 to fabricate a pin photodetector, according to various embodiments of the invention. The method comprises the following steps:

In step 402, a first semiconductor layer having a region doped to a first polarity is provided. In step 404, a second semiconductor layer having a region doped to a second polarity is provided, with the second polarity being opposite to the first polarity. In step 406, a dopant diffusion barrier layer is provided between the first semiconductor layer and the second semiconductor layer.

In step 408, the first semiconductor layer is doped to form a higher doped portion within the region doped to a first polarity. The dopant diffusion barrier layer reduces doping of the first polarity to an intrinsic layer between the dopant diffusion barrier layer and the second semiconductor layer. This causes the dopant diffusion barrier layer to be disposed between the first semiconductor layer and the intrinsic layer, and the intrinsic layer to be disposed between the dopant diffusion barrier layer and the second semiconductor layer. Due to the blocking effect of the dopant diffusion barrier layer, the intrinsic layer has a region doped to the first polarity to a concentration less than that of the higher doped portion of the first semiconductor layer.

Steps 402, 404, 406 and 408 are to be understood as not necessarily occurring in sequence. In one embodiment of the invention, the first semiconductor layer, the dopant diffusion barrier layer and the intrinsic layer may be formed from a multilayer structure that sandwiches the dopant diffusion barrier layer between two layers. Doping the stack causes an exposed layer of the two layers to form the first semiconductor layer, while the dopant diffusion barrier layer inhibits the dopant from diffusing deeper into the stack, thereby creating the intrinsic layer within the other of the two layers. The intrinsic layer formed in step 408 may comprise material that is the same as that of the first semiconductor layer.

In a preferred embodiment, the dopant diffusion barrier layer is provided as an in-situ grown Si interlayer for controlled dopant diffusion. Consider the above multilayer structure with such an interlayer acting as an interface between the two layers. When fabricating a pin photodetector comprising such a multilayered structure, a first of the two layers is exposed to dopant, while the interlayer serves to reduce, or even prevent, the dopant from diffusing into a second of the two layers. The dopant diffusion barrier layer allows a higher anneal temperature to be used (as compared to the dopant diffusion barrier layer being absent) for better implant activation and defect repair without adversely affecting the intrinsic region. In known pin photodetectors, an ex-situ additional semiconductor layer (e.g. doped poly-Si) is used to form the higher doped regions mentioned above. The dopant diffusion barrier layer eliminates the need to use this additional layer.

Figure 4B:
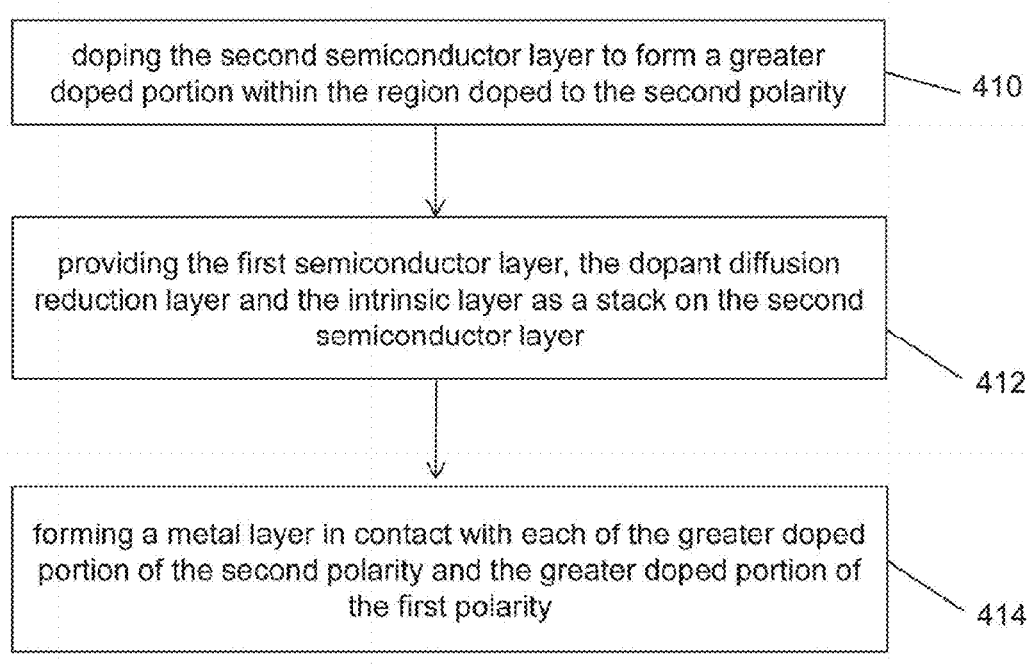

To complete the fabrication of the pin photodetector referred to in FIG. 4A, the following further steps may be carried out, as shown in FIG. 4B. These further steps 410, 412 and 414 are to be understood as not necessarily occurring in sequence.

In step 410, the second semiconductor layer (of step 404 of FIG. 4A) is doped to form a higher doped portion within the region doped to the second polarity. In step 412, the first semiconductor layer, the dopant diffusion barrier layer and the intrinsic layer (mentioned in one or more of the steps 402 to 408 of FIG. 4A) may be provided as a stack on the second semiconductor layer. In step 414, a metal layer is formed to be in contact with each of the higher doped portion of the second polarity and the higher doped portion of the first polarity (respectively from step 410 of FIG. 4B and step 408 of FIG. 4A).

FIGS. 5A to 5D each show a stage within an exemplary process, which implements the method 400 described above in respect of FIGS. 4A and 4B, to fabricate a vertical waveguided Ge-based photodetector. The process comprises the following stages: i) Si waveguide/passives formation; ii) bottom P+ substrate and P++ contact implant (using, for example, boron) and activation anneal; iii) Ge selective epitaxy growth with an in-situ Si interlayer growth (Si interlayer thickness<=5 nm); iv) top Ge N++ implant (using, for example, phosphorus) and activation anneal; and v) metallization and deep trench etch. Further details of the method 400 are as follows.

Figure 5A:
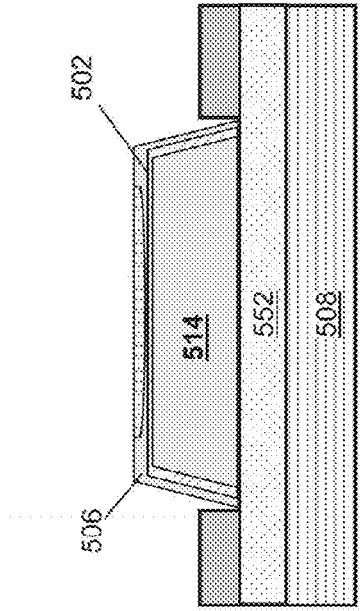
FIGS. 5A to 5D each show a stage within an exemplary process to fabricate a vertical waveguided Ge-based photodetector.

FIG. 5A: Si WG etch and p implant into Si

Firstly, a Si WG (not shown in FIG. 5A, but see FIG. 3A) is patterned and p ion implantation (using, for example, boron) is performed into a SOI (silicon on insulator) substrate 550 that comprises a top Si slab 552 and a buried oxide layer 508. With reference to FIGS. 4A and 4B, this results in the formation of the second semiconductor layer having a region doped to the second polarity of step 404 and, within this region, a greater doped portion to the second polarity of step 410. The Si slab 552 and the WG height may follow the initial thickness of an SOI wafer, which is around 220 nm. The Si WG width may be around 500 nm with a nanotaper width of around 200 nm at the ends to allow efficient fibre-to-WG coupling and vice versa.

Figure 5B:
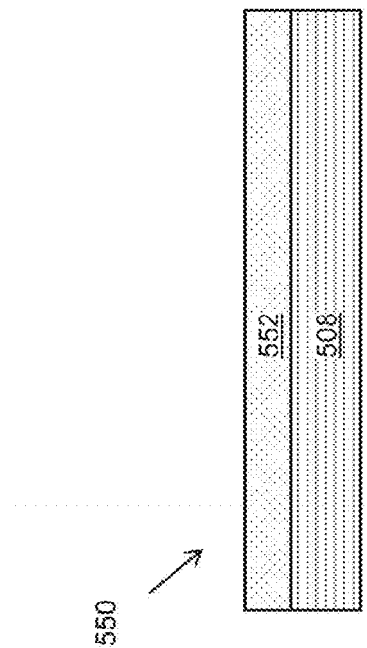

FIG. 5B: Selective Ge epitaxy with Si interlayer

A dielectric layer 540 (using, for example, SiO$_2$) may first be grown as a mask for selective epitaxy (growth of the layers 514, 502 and 506) shown in FIG. 5B. The regions with the dielectric layer 540 will prevent epitaxy growth on the Si slab 552. Next, a Ge stack 522 is formed by a selective epitaxy process using ultra-high vacuum chemical vapour deposition (UHV-CVD). Other CVD processes can be used, e.g. reduced pressure CVD (RPCVD). Approximately 500 nm of Ge may be grown to form a bulk region 514. This was followed by in-situ deposition of a 5 nm thick silicon interlayer (Si IL) 502 (resulting in the formation of the dopant diffusion barrier layer of step 406 of FIG. 4A) and finally an approximately 50 nm thick top Ge epitaxial layer 506 (resulting in the formation of the first semiconductor layer having a region doped to the first polarity of step 402 of FIG. 4A) for junction formation.

The epitaxy process to grow the bulk region 514 may be performed using a low temperature Ge seed at around 400° C. and a higher temperature cyclic Ge growth at around 550° C. The Si interlayer 502 may also be grown at around 550° C., while the top Ge epitaxial layer 506 may be grown at around 400° C.

Figure 5C:
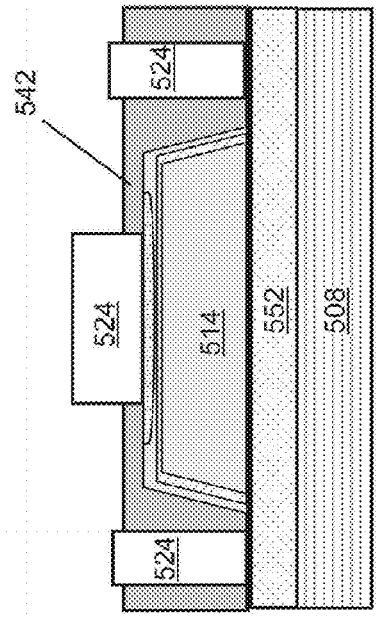

FIG. 5C: n-implant and anneal

After the Ge epitaxial stack 522 formation, the top Ge epitaxial layer 506 is doped by n ion implantation (using, for example, phosphorus) using a photoresist mask (not shown), which results in the formation of the first semiconductor layer having the higher doped region of the first polarity of step 408 of FIG. 4A. The Si interlayer 502 serves to counter diffusion of the n dopant into the bulk region 514, thereby forming the intrinsic layer (of step 408 of FIG. 4A) within the bulk region 514. This implant activation anneal may be generally done at temperatures up to 700° C., but temperatures higher than 700° C. with a shorten anneal time can possibly be used.

Figure 5D:
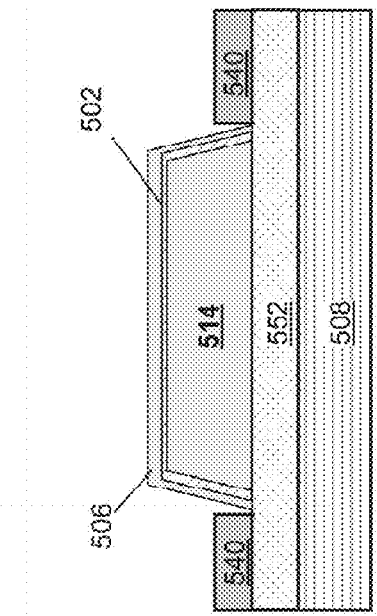

FIG. 5D: Metallization

The implant activation anneal of FIG. 5C is followed by interlayer dielectric (ILD) 542 deposition. Contact holes are formed within the ILD 542 that expose portions of the Si slab 552 and portions of the top Ge epitaxial layer 506 for Al metallization 524 to form the metal layer of step 414 of FIG. 4B. An optional 5 nm cap (not shown) may then be provided for passivation.

For material analysis, Ge epitaxial stacks with Si interlayer thicknesses of 2.5 and 5 nm were grown and implanted with phosphorus. Secondary ion mass spectrometer (SIMS) analysis was subsequently carried out to analyze phosphorus (P) diffusion into bulk Ge after different anneals for Ge epitaxial stacks with and without Si interlayer.

Figures 6A, 6B, 6C:
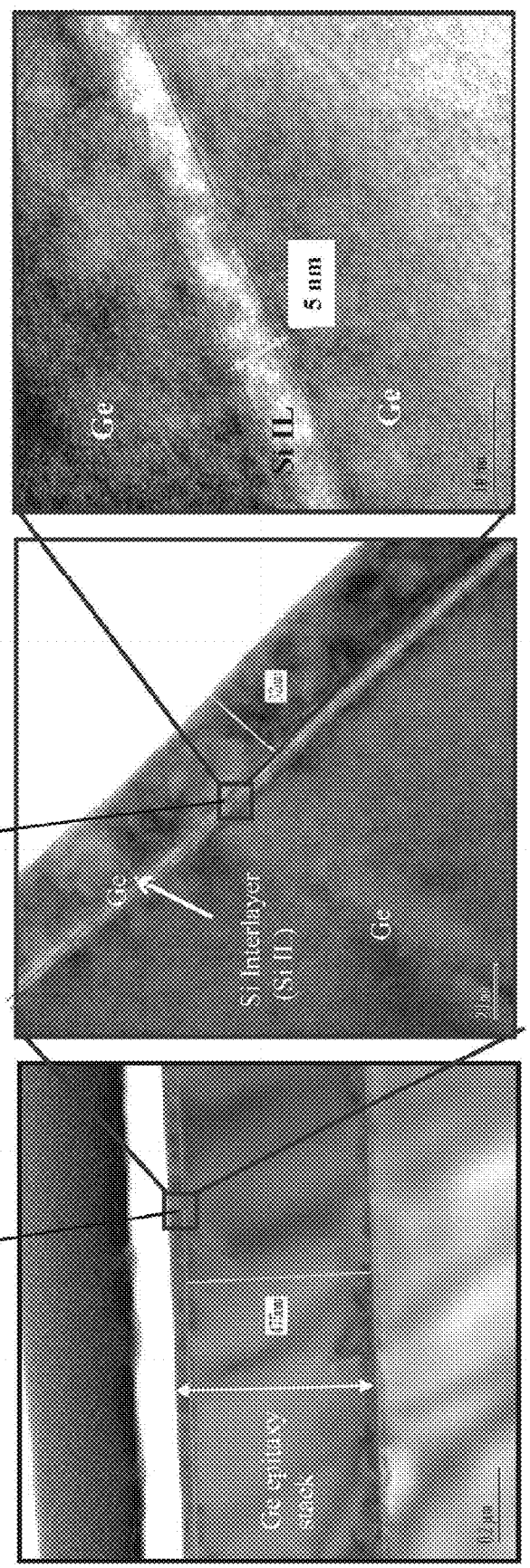
FIGS. 6A, 6B and 6C show transmission electron microscope (TEM) images of the cross-section of a germanium (Ge) epitaxial stack after phosphorus (P) implantation and annealing.

Transmission electron microscope (TEM) images of the cross-section of a Ge epitaxial stack after P implantation and annealing at around 600° C. for 5 min are shown in FIGS. 6A, 6B and 6C, where the Ge epitaxial stack has a Si interlayer of around 5 nm thickness (see FIG. 6C). The thickness of the top Ge layer can be controlled to fix junction depth.

FIG. 6B shows an enlarged view of portion 602 of FIG. 6A, while FIG. 6C in turn shows an enlarged view of portion 604 of FIG. 6B. The images show that the Si interlayer remains intact after annealing and little intermixing between Si and Ge has occurred. The Si interlayer is seen to be continuous, which facilitates uniformly preventing dopant diffusion downwards into the Ge stack.

Figure 7A:
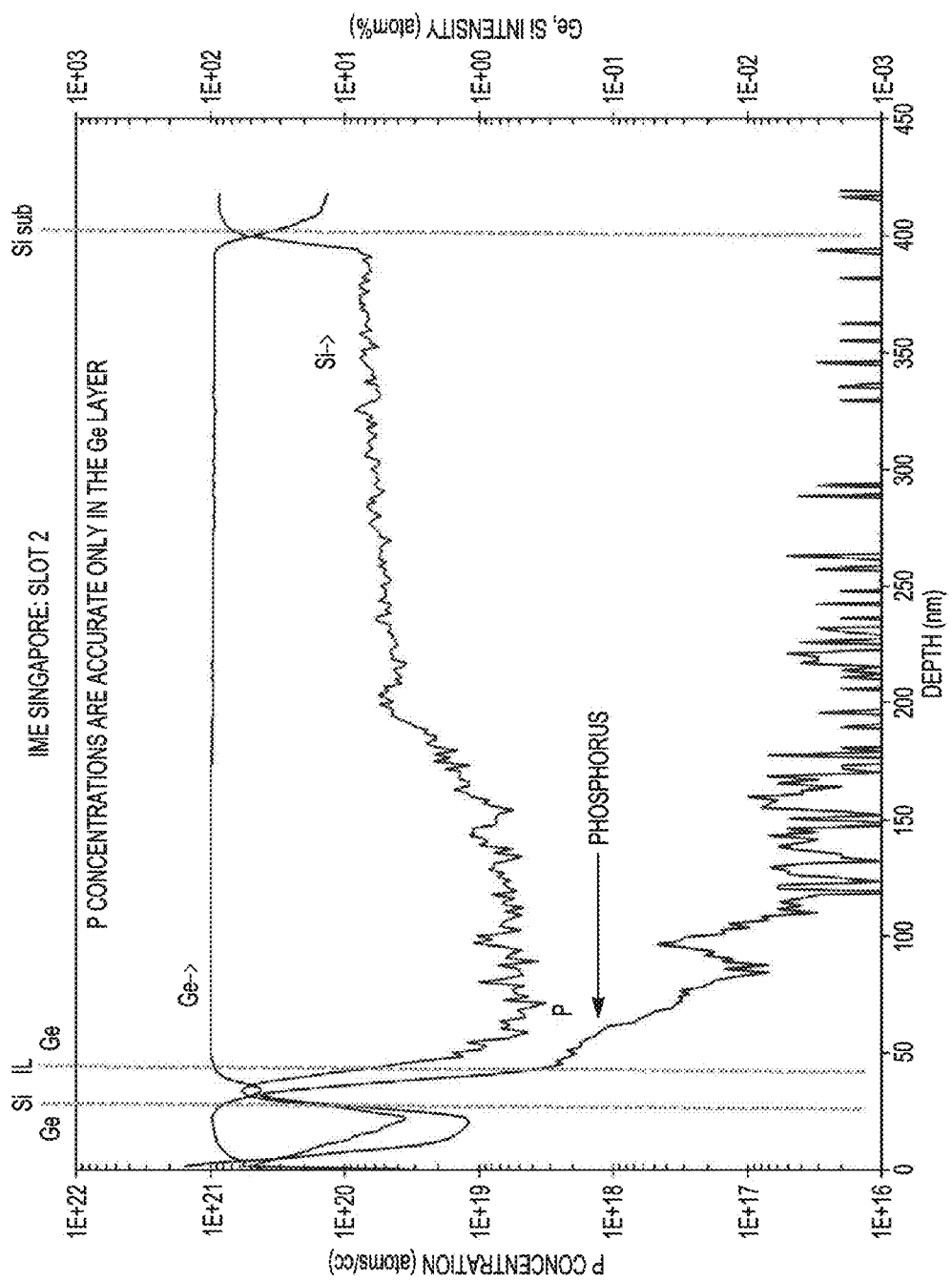
FIG. 7A shows secondary ion mass spectrometer (SIMS) data for the Ge stack, having a Si interlayer (IL)

FIG. 7A shows SIMS data for the Ge stack, having the Si interlayer as described above with respect to FIGS. 6A to 6C. It can be observed that the Si interlayer is effective in preventing P diffusion into bulk Ge (denoted using the reference numeral 702).

Figure 7B:
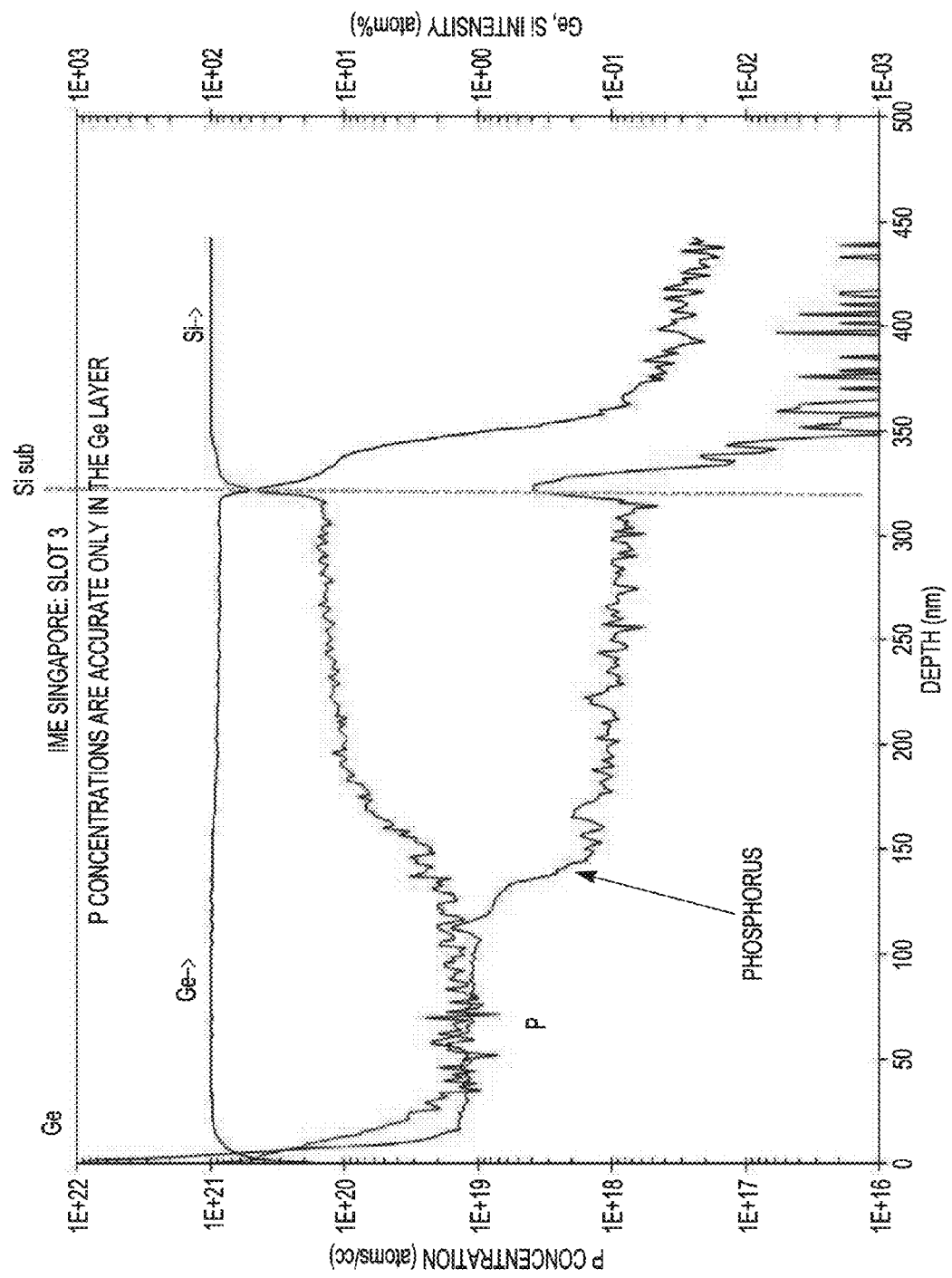
FIG. 7B shows SIMS data for a Ge stack without a Si IL.

FIG. 7B shows SIMS data for a Ge stack without Si interlayer. High P diffusion has occurred, which increases the P concentration in Ge (denoted using the reference numeral 704) to about 1e18 to 1e19 cm$^{-3}$. This increases dark current and reduces photodetector bandwidth due to increased device capacitance at a particular operating voltage. Thus, in comparison, using a Ge stack with a Si interlayer, as shown in FIGS. 6A to 6C, provides for a photodetector with better bandwidth.

Figure 8:
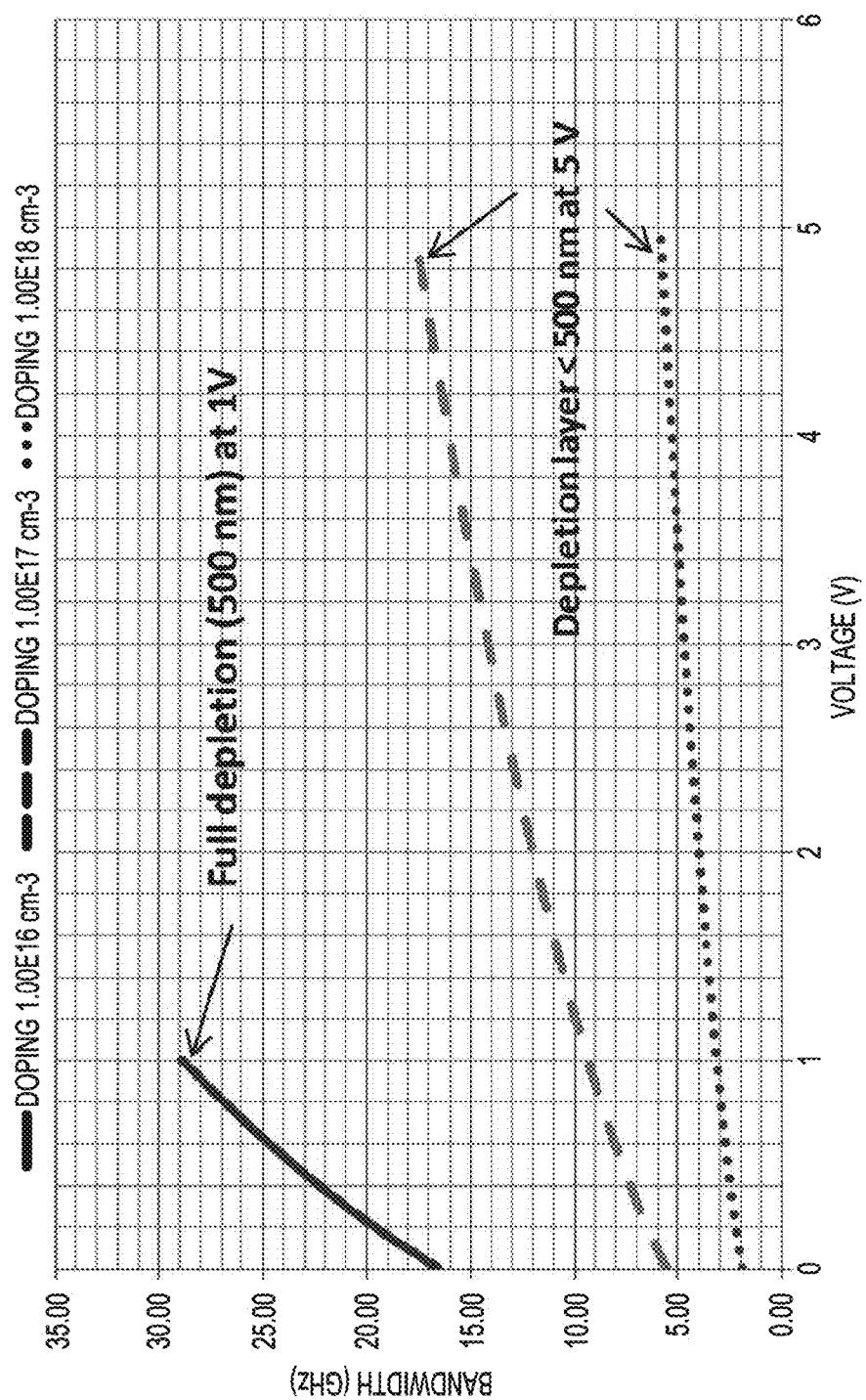
FIG. 8 plots 3 dB bandwidth (RC-limited) results for Ge epitaxial stacks with different doping concentrations and varying operating bias.

Based on the SIMS results, 3 dB RC-limited bandwidths achievable for different Ge stacks of around 500 nm thickness, with and without Si interlayer, are calculated. FIG. 8 plots these 3 dB bandwidth (RC-limited) results for these Ge epitaxial stacks with different doping concentrations and varying operating bias, where the Ge photodetector is taken to be 8×25 um. After 600° C. anneal, the intrinsic doping concentration is 1e16 cm$^{-3}$ and 1e18 cm$^{-3}$ for Ge epitaxial stack with and without Si interlayer, respectively. The RC-limited 3 dB bandwidth ($f_{3dB,RC}$) is calculated using:

$$f_{3dB,RC} \approx \frac{1}{2\pi RC} \quad (1)$$

whereby R is the series resistance and C is the device capacitance. The series resistance is estimated to be 100Ω. It is clearly seen that with a lower intrinsic bulk concentration of $1e16\ cm^{-3}$, a higher bandwidth is achieved for a photodetector using a Ge stack with a Si interlayer, compared to a photodetector using a Ge stack without a Si interlayer. At Ge thickness of 500 nm for vertical pin Ge PDs, the device bandwidth is not limited by the transit time, since the distance between vertical electrodes is small. Therefore, the calculated RC-limited bandwidth is a good representation of the device bandwidth.

In addition, for a photodetector with thin intrinsic regions (<500 nm), it is preferable to have sharp and abrupt junction profiles. Any variation in intrinsic region thickness due to dopant diffusion would have a significant effect on the device capacitance. It is observed that the junction depth for Si interlayer split is around 30 to 60 nm shallower than the control Ge epitaxial stack. The junction depth is taken when P concentration hits $1e16\ cm^{-3}$, since the intrinsic doping concentration of Ge is around $1e16\ cm^{-3}$. There is uncertainty on the exact location of the junction because of the knock-on effect of frontside SIMS, and a more precise location of the junction can be known using backside SIMS profiling. Nevertheless, an estimation of the bandwidth can be made. The 3 dB RC-limited bandwidth is calculated to be higher for Ge photodetector with Si interlayer with the same physical epitaxial thickness as one without the Si interlayer. With a targeted i-Ge thickness of 300 nm, the Si interlayer split is estimated to have 10 to 25% higher bandwidth. When the i-Ge thickness drops to 200 nm, this bandwidth gain increases to 20 to 40% over the control Ge photodetector.

From the above, a preferred embodiment of the invention provides a Ge epitaxial stack for photodetectors. This epitaxial stack comprises a thin Si interlayer that acts as a diffusion barrier to prevent dopant diffusion into bulk Ge and that can form abrupt junctions. The Ge epitaxy stack has a sandwiched thin in-situ silicon epitaxial layer. Through this Ge stack, shallow and abrupt junctions can be achieved at higher annealing temperatures like 625° C. Enhancement in device bandwidth is predicted from precise control of junction profile in the Ge photodetector using this epitaxial stack. A simple fabrication process flow is used to fabricate such a Ge photodetector, with only an insertion of a thin silicon interlayer during Ge epitaxy process. A design and fabrication process scheme can be implemented to realise vertical pin structure photodetector with applications in both surface-illuminated and waveguided detectors.

It will be appreciated by a person skilled in the art that numerous variations and/or modifications may be made to the present invention as shown in the embodiments without departing from a spirit or scope of the invention as broadly described. The embodiments are, therefore, to be considered in all respects to be illustrative and not restrictive.

What is claimed is:

1. A p-i-n photodetector comprising:
   a dopant diffusion barrier layer disposed within an active light absorbing region of the p-i-n photodetector, wherein the dopant diffusion barrier layer has a thickness less than 5 nm;
   a first semiconductor layer having a region doped to a first polarity;
   a second semiconductor layer having a region doped to a second polarity, the second polarity being opposite to the first polarity,
   wherein the dopant diffusion barrier layer is disposed between the first semiconductor layer and the second semiconductor layer for reducing doping of the first polarity into the region between the dopant diffusion barrier layer and the second semiconductor layer, and wherein the region doped to the first polarity of the first semiconductor layer has a higher doped portion and wherein the region doped to the second polarity of the second semiconductor layer has a higher doped portion, so that the higher doped portion of the second polarity and the higher doped portion of the first polarity form a pn junction of the p-i-n photodetector.

2. The p-i-n photodetector of claim 1, further comprising an intrinsic layer, located so that the dopant diffusion barrier layer is disposed between the first semiconductor layer and the intrinsic layer and the intrinsic layer is disposed between the dopant diffusion barrier layer and the second semiconductor layer.

3. The p-i-n photodetector of claim 2, wherein the first semiconductor layer, the dopant diffusion barrier layer and the intrinsic layer are provided as a stack on the second semiconductor layer such that the respective bases of the first semiconductor layer, the dopant diffusion barrier layer and the intrinsic layer extend to be in contact with a surface of the second semiconductor layer.

4. The p-i-n photodetector of claim 2, further comprising a metal layer in contact with each of the higher doped portion of the second polarity and the higher doped portion of the first polarity.

5. The p-i-n photodetector of claim 2, wherein the intrinsic layer comprises material that is the same as that of the first semiconductor layer.

6. The p-i-n photodetector of claim 1, further comprising an intrinsic layer, located so that the dopant diffusion barrier layer is disposed between the first semiconductor layer and the intrinsic layer, and the intrinsic layer is disposed between the dopant diffusion barrier layer and the second semiconductor layer, wherein the intrinsic layer has a region doped to the first polarity to a concentration less than that of the higher doped portion of the first semiconductor layer due to the presence of the dopant diffusion barrier layer.

7. The p-i-n photodetector of claim 1, wherein the dopant diffusion barrier layer comprises material that is different from the first semiconductor layer.

8. The p-i-n photodetector of claim 7, wherein the first semiconductor layer and the dopant diffusion barrier layer comprise materials from any one or more of Group IV semiconductors, an alloy of Group IV semiconductors and Group III-V semiconductor compounds.

9. The p-i-n photodetector of claim 8, wherein the first semiconductor layer comprises germanium and the dopant diffusion barrier layer comprises silicon or a silicon-germanium alloy; or wherein the first semiconductor layer comprises a silicon-germanium alloy and the dopant diffusion barrier layer comprises silicon.

10. The p-i-n photodetector of claim 1, wherein the second semiconductor layer comprises silicon, germanium or a silicon-germanium alloy.

11. The p-i-n photodetector of claim 1, wherein the first polarity is from doping the first semiconductor layer with an n-type dopant.

12. The p-i-n photodetector of claim 1, wherein the second polarity is from doping the second semiconductor layer with a p-type dopant.

13. A method of fabricating a p-i-n photodetector, the method comprising:
   providing a first semiconductor layer having a region doped to a first polarity;
   providing a second semiconductor layer having a region doped to a second polarity, the second polarity being opposite to the first polarity;

providing a dopant diffusion barrier layer between the first semiconductor layer and the second semiconductor layer, the dopant diffusion barrier layer having a thickness of less than 5 nm and configured to reduce doping of the first polarity into the region between the dopant diffusion barrier layer and the second semiconductor layer;

doping the first semiconductor layer to a higher doped portion within the region doped to a first polarity;

doping the second semiconductor layer to a higher doped portion within the region doped to a second polarity; and forming a pn junction of the p-i-n photodetector using the higher doped portion of the second polarity and the higher doped portion of the first polarity.

14. The method of claim 13, further comprising providing the first semiconductor layer, the dopant diffusion barrier layer and the intrinsic layer as a stack on the second semiconductor layer.

15. The method of claim 14, further comprising forming a metal layer in contact with each of the higher doped portion of the second polarity and the higher doped portion of the first polarity.

16. The method of claim 13, wherein the dopant diffusion barrier layer reduces doping of the first polarity to form an intrinsic layer between the dopant diffusion barrier layer and the second semiconductor layer, so that the dopant diffusion barrier layer is disposed between the first semiconductor layer and the intrinsic layer, and the intrinsic layer is disposed between the dopant diffusion barrier layer and the second semiconductor layer, wherein the intrinsic layer has a region doped to the first polarity to a concentration less than that of the higher doped portion of the first semiconductor layer.

17. The method of claim 16, wherein the intrinsic layer comprises material that is the same as that of the first semiconductor layer.

* * * * *